(12) United States Patent
Sun

(10) Patent No.: US 12,156,423 B2
(45) Date of Patent: Nov. 26, 2024

(54) COMPOSITE FILM AND MANUFACTURING METHOD THEREOF, AND ENCAPSULATION STRUCTURE INCLUDING THE COMPOSITE FILM

(71) Applicant: BOE TECHNOLOGY GROUP CO., LTD., Beijing (CN)

(72) Inventor: Li Sun, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 1122 days.

(21) Appl. No.: 16/987,610

(22) Filed: Aug. 7, 2020

(65) Prior Publication Data

US 2020/0365830 A1 Nov. 19, 2020

Related U.S. Application Data

(62) Division of application No. 14/421,533, filed as application No. PCT/CN2014/080478 on Jun. 23, 2014, now abandoned.

(30) Foreign Application Priority Data

Oct. 31, 2013 (CN) .......................... 201310529205.4

(51) Int. Cl.
*H10K 50/844* (2023.01)
*B32B 7/03* (2019.01)
(Continued)

(52) U.S. Cl.
CPC .......... *H10K 50/8445* (2023.02); *B32B 7/03* (2019.01); *B32B 27/06* (2013.01); *B32B 27/08* (2013.01);
(Continued)

(58) Field of Classification Search
CPC .................. H10K 50/844–8445; H01L 23/564
See application file for complete search history.

(56) References Cited

U.S. PATENT DOCUMENTS

| 7,781,034 B2 | 8/2010 | Yializis et al. |
| 2002/0140347 A1 | 10/2002 | Weaver |

(Continued)

FOREIGN PATENT DOCUMENTS

| CN | 1418042 A | 5/2003 |
| CN | 1524301 A | 8/2004 |

(Continued)

OTHER PUBLICATIONS

International Application No. PCT/CN2014/080478, International Search report dated Sep. 17, 2014, twelve (12) pages.
(Continued)

Primary Examiner — Amar Movva
(74) Attorney, Agent, or Firm — Nath, Goldberg & Meyer; Joshua B. Goldberg

(57) ABSTRACT

The present invention discloses a composite film, a manufacturing method thereof and an encapsulation structure comprising the composite film. The composite film comprises at least one matrix membrane, each of which comprises at least one waterproof film. In the technical solutions provided by the present invention, the composite film comprises a matrix membrane comprising at least one waterproof film, and therefore, the composite film can be directly disposed on an OLED when the OLED is encapsulated by using the composite film. Accordingly, during an encapsulation process, the used process is simple, the process steps become less, the process time is short, and the required equipment is simpler, so that the production cost is reduced, and the production efficiency is improved.

3 Claims, 6 Drawing Sheets

(51) Int. Cl.
- *B32B 27/06* (2006.01)
- *B32B 27/08* (2006.01)
- *B32B 27/28* (2006.01)
- *B32B 27/30* (2006.01)
- *B32B 27/32* (2006.01)
- *B32B 27/36* (2006.01)
- *B32B 33/00* (2006.01)
- *B32B 37/02* (2006.01)
- *B32B 37/24* (2006.01)
- *H10K 50/84* (2023.01)
- *H10K 71/00* (2023.01)

(52) U.S. Cl.
CPC .......... *B32B 27/281* (2013.01); *B32B 27/286* (2013.01); *B32B 27/302* (2013.01); *B32B 27/304* (2013.01); *B32B 27/32* (2013.01); *B32B 27/36* (2013.01); *B32B 27/365* (2013.01); *B32B 33/00* (2013.01); *B32B 37/02* (2013.01); *B32B 37/24* (2013.01); *B32B 2037/243* (2013.01); *B32B 2255/10* (2013.01); *B32B 2255/20* (2013.01); *B32B 2255/205* (2013.01); *B32B 2307/7244* (2013.01); *B32B 2307/7265* (2013.01); *B32B 2310/0831* (2013.01); *B32B 2398/10* (2013.01); *B32B 2439/00* (2013.01); *B32B 2457/206* (2013.01); *H10K 50/841* (2023.02); *H10K 71/00* (2023.02)

(56) References Cited

U.S. PATENT DOCUMENTS

| | | | |
|---|---|---|---|
| 2007/0184292 A1* | 8/2007 | Lee | .................... H10K 50/8445 428/522 |
| 2009/0297675 A1 | 12/2009 | Grah et al. | |
| 2011/0185948 A1 | 8/2011 | Uemura et al. | |

FOREIGN PATENT DOCUMENTS

| | | |
|---|---|---|
| CN | 102593371 A | 7/2012 |
| CN | 202523728 U | 11/2012 |
| CN | 103158289 A | 6/2013 |
| CN | 103647025 A | 3/2014 |
| EP | 2346107 A2 | 7/2011 |

OTHER PUBLICATIONS

Chinese Patent Application No. 201310529205.4, Office Action dated Jun. 24, 2015, eight (8) pages, English translation attached, fourteen (14) pages.

International Patent Application No. PCT/CN2014/080478, Written Opinion of the International Searching Authority dated Sep. 30, 2014, seven (7) pages.

First Office Action dated Dec. 25, 2018 corresponding to Chinese Divisional application No. 201711219151.6.

* cited by examiner

COMPOSITE FILM AND MANUFACTURING METHOD THEREOF, AND ENCAPSULATION STRUCTURE INCLUDING THE COMPOSITE FILM

FIELD OF THE INVENTION

The present invention relates to the field of display technology, and particularly relates to a composite film and a manufacturing method thereof, and an encapsulation structure including the composite film.

BACKGROUND OF THE INVENTION

Organic Light-Emitting Diodes (OLEDs) have the characteristic of self-illumination, and OLEDs emit light when current passes therethrough. OLED display devices which perform display by using OLEDs have a large visual angle, and can significantly save electric energy, and therefore, OLED display devices are more and more widely used in the field of display technology due to many unparalleled advantages compared with Liquid Crystal Displays (LCDs).

Organic film layers in the OLEDs are likely to fail due to the erosion of water and oxygen, and therefore, it is required to form an encapsulation layer capable of blocking water and oxygen above the OLEDs so as to protect the OLEDs. Generally, the encapsulation layer is a high water-tightness hard encapsulation substrate, such as a glass or metal plate. Packaging adhesive is coated on a region, outside an OLED, of the substrate for carrying the OLED, and the substrate for carrying the OLED and the hard encapsulation substrate are bonded with each other by the packaging adhesive, so as to form a closed space impenetrable to water and oxygen molecules between the two substrates, and the OLED is thus protected. However, the hard encapsulation substrate belongs to a rigid device, which has poor flexibility, and therefore, it is not suitable for packaging flexible OLEDs.

To solve the problem that the hard encapsulation substrate is not suitable for packaging a flexible OLED, a technical solution in which a waterproof film is used as an encapsulation layer has been proposed in the prior art. The waterproof film may be a dense film, such as SiOx, but the dense film has poor bendability; or, the waterproof film may be a film with good bendability, such as a polymer film, but the film with good bendability has poor water-tightness. Therefore, to obtain an encapsulation layer with both good water-tightness and bendability in the prior art, a structure in which inorganic films and organic films alternately arranged is generally used as the encapsulation layer. However, as there are many film layers in such encapsulation layer and a structure of each layer needs to be manufactured by using a corresponding film manufacturing process according to the material thereof, many types of film manufacturing processes and many steps are required in the process of manufacturing the encapsulation layer, and the manufacturing time is long; moreover, the manufacturing process needs to be performed under an inert protecting environment (for example, a vacuum or nitrogen environment), and many complicated equipment need to be used in the manufacturing process. Thus, the production cost is improved, and the production efficiency is reduced.

SUMMARY OF THE INVENTION

The present invention provides a composite film and a manufacturing method thereof, and an encapsulation structure including the composite film, in order to reduce production cost and improve production efficiency.

To achieve the above object, the present invention provides a composite film comprising at least one matrix membrane, each of which includes at least one waterproof film.

Optionally, the number of the at least one matrix membrane is more than one, each of the matrix membranes includes a plurality of waterproof films, and the waterproof films in adjacent matrix membranes are staggered with each other.

Optionally, a spacing is formed between any adjacent waterproof films in each of the matrix membranes, and each spacing in one of the matrix membranes is opposite to the waterproof film in a matrix membrane adjacent to said one of matrix membranes.

Optionally, the plurality of waterproof films in a same matrix membrane are arranged in a same plane.

Optionally, the number of the matrix membranes is two to four.

Optionally, the number of the at least one matrix membrane is one, the number of the at least one waterproof film is more than one, the more than one waterproof films are arranged in a plurality of layers, and the waterproof films in adjacent layers are staggered with each other.

Optionally, a spacing is formed between any adjacent waterproof films in each layer, and each spacing in one layer is opposite to the waterproof film in a layer adjacent to said one layer.

Optionally, a thickness of the matrix membrane is 1 μm-1000 μm.

Optionally, the matrix membrane is a flexible film, and the waterproof film is a rigid film.

To achieve the above object, the present invention provides an encapsulation structure, including a substrate, an OLED and the above composite film, wherein the OLED is located on the substrate, and the composite film is located on the OLED.

To achieve the above object, the present invention provides a manufacturing method of a composite film, including a step of:

forming at least one matrix membrane, and forming at least one waterproof film inside the matrix membrane in a process of forming the at least one matrix membrane.

Optionally, the step of forming at least one matrix membrane and forming at least one waterproof film inside the matrix membrane in the process of forming the at least one matrix membrane further includes:

a) forming a matrix membrane precursor layer;

b) forming at least one waterproof film on the matrix membrane precursor layer;

c) forming another matrix membrane precursor layer on the at least one waterproof film; and d) performing a curing process to form one matrix membrane.

Optionally, the method further includes steps of: executing steps a)-d) repeatedly to obtain a plurality of matrix membranes, and laminating the plurality of matrix membranes to form a composite film including the plurality of laminated matrix membranes, wherein the waterproof films in two adjacent matrix membranes are staggered with each other.

Optionally, the step of forming at least one matrix membrane and forming at least one waterproof film inside the matrix membrane in the process of forming the at least one matrix membrane further includes:

e) forming a matrix membrane precursor layer; and f) forming a waterproof film layer including at least one waterproof film on the matrix membrane precursor layer, and forming another matrix membrane precursor layer on the at least one waterproof film layer;

executing step f) repeatedly until a required number of waterproof film layers are formed, wherein the at least one waterproof film in any one waterproof film layer and the at least one waterproof film in a waterproof film layer adjacent to said one waterproof film layer are staggered with each other; and performing a curing process on all the formed matrix membrane precursor layers and waterproof film layers to form the matrix membrane, so as to obtain a composite film including one matrix membrane.

Optionally, performing a curing process comprises: performing the curing process through UV curing or thermocuring.

The present invention has the following beneficial effects:

In the technical solutions of the composite film and manufacturing method thereof and encapsulation structure provided by the present invention, the composite film includes a matrix membrane and at least one waterproof film located inside the matrix membrane. The composite film can be directly disposed on an OLED when the OLED is encapsulated by using the composite film. Accordingly, during an encapsulation process, the used process is simple, process steps become less, the process time is short, and the required equipment is simpler, so that the production cost is reduced, and the production efficiency is improved.

DETAILED DESCRIPTION OF THE EMBODIMENTS

To make those skilled in the art better understand the technical solutions of the present invention, the composite film and manufacturing method thereof and the encapsulation structure provided by the present invention will be described in details below with reference to the accompanying drawings.

As one aspect of the present invention, there is provided a composite film including at least one matrix membrane, each of which includes at least one waterproof film.

Figure 1:
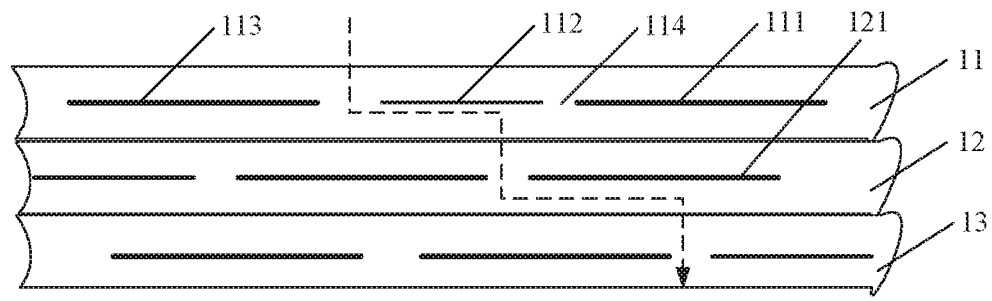
FIG. 1 is a diagram of a structure of a composite film according to Embodiment 1 of the present invention.

FIG. 1 is a schematic diagram of an exemplary structure of a composite film provided by Embodiment 1 of the present invention. As shown in FIG. 1, there may be a plurality of matrix membranes, that is, the composite film may include a plurality of matrix membranes which are stacked up. Preferably, the number of the matrix membranes is two to four. In this embodiment, the description is given by taking a case that the number of the matrix membranes is three as an example. The three matrix membranes are a matrix membrane 11, a matrix membrane 12 and a matrix membrane 13, respectively. The matrix membrane 11, the matrix membrane 12 and the matrix membrane 13 are stacked up, here, the matrix membrane 11 is located on the matrix membrane 12, and the matrix membrane 12 is located on the matrix membrane 13.

Preferably, the thickness of each of the matrix membranes is 1 μm-1000 μm. In this embodiment, as the thickness of each of the matrix membranes is 1 μm-1000 μm, both the problem of poor mechanical performance and poor watertightness due to too small thickness of each of the matrix membranes and the problem of poor bendability and poor light transmission due to too large thickness of each of the matrix membranes can be effectively avoided, thus not only good mechanical performance and water-tightness of the matrix membranes but also good bendability and light transmission of the matrix membranes are ensured. Preferably, each of the matrix membranes is the same in thickness. The fact that the matrix membranes each have the same thickness facilitates manufacturing.

Preferably, the matrix membranes are flexible films. The material of the matrix membranes may be selected from a group comprising the following materials: polyimide, polyacrylate, polyethylene, polypropylene, polystyrene, polyethylene glycol terephthalate, polyethersulfone, polyethylene naphthalate, polycarbonate, polyvinyl chloride, polymethyl methacrylate, polybutylene terephthalate and poly(p-phenyl diethylsulfone). The waterproof films are rigid films. The material of the waterproof films may be selected from a group comprising the following materials: $SiO_x$, $SiN_x$, Al$_2$O$_3$, Al, Ag, gold, ultrathin glass, diamond, graphene, ZnO, ZrO, and TiO$_2$. However, both the material of the matrix membranes and the material of the waterproof films are not limited to the above-listed materials.

Figure 2:
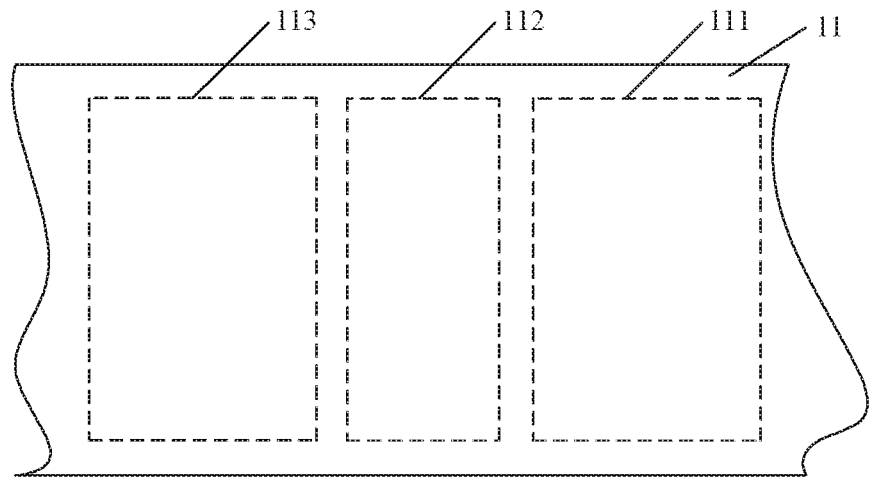
FIG. 2 is a plan diagram of a matrix membrane in the composite film according to Embodiment 1 of the present invention.

There may be a plurality of waterproof films in each of the matrix membranes. The waterproof films are capable of blocking water and oxygen molecules. The waterproof films in the matrix membranes will be described below by taking the matrix membrane 11 as an example. FIG. 2 is a plan diagram of the matrix membrane 11, and there are a plurality of waterproof films in the matrix membrane 11. In FIG. 1 and FIG. 2, three waterproof films, i.e., a waterproof film 111, a waterproof film 112 and a waterproof film 113, located in the matrix membrane 11 are shown. It should be understood that, the number of the waterproof films in the substrate 11 as shown in FIG. 2 is merely exemplary, and the present invention is not limited thereto. Preferably, the plurality of waterproof films in a same matrix membrane are arranged in a same plane. As shown in FIG. 2, the waterproof film 111, the waterproof film 112 and the waterproof film 113 in the matrix membrane 11 are arranged in a same plane. The fact that the plurality of waterproof films are located in a same plane makes the manufacturing process of the waterproof films simple and easy to implement. The structures of the waterproof films in the matrix membrane 12 and the matrix membrane 13 may refer to the description of the matrix membrane 11, and will not be repeated redundantly here. Preferably, the waterproof films in each of the matrix membranes are arranged at uniform intervals.

Preferably, the waterproof films in adjacent matrix membranes are staggered with each other. As shown in FIG. 1 and FIG. 2, the waterproof films in the substrate 11 are staggered with the waterproof films in the matrix membrane 12, and the waterproof films in the matrix membrane 12 are staggered with the waterproof films in the matrix membrane 13. Specifically, a spacing is formed between adjacent waterproof films in each matrix membrane, and the spacing between adjacent waterproof films in one matrix membrane is arranged opposite to the waterproof film in a matrix membrane adjacent to the one matrix membrane. As the transverse width of each spacing (the distance between any two adjacent waterproof films in a same matrix membrane) is less than that of the waterproof film opposite to the spacing, the spacing between the waterproof films in this matrix membrane is covered by the waterproof film in the adjacent matrix membrane. As shown in FIG. 1 and FIG. 2, for example, a spacing 114 is formed between the waterproof film 111 and the waterproof film 112 in the matrix membrane 11, and the spacing 114 and the waterproof film 121 in the adjacent matrix membrane 12 are provided oppositely, so that the projection of the spacing 114 on the bottom surface of the matrix membrane 11 is within the range of the projection of the waterproof film 121 on the bottom surface of the matrix membrane 11. As the matrix membranes are flexible films while the waterproof films are rigid films, the spacings between the waterproof films allow that the whole composite film can be bent to a certain degree, and it is ensured that the composite film has good bendability, so that the composite film is applicable to flexible OLEDs. In this embodiment, the bendability of the composite film is related to the size and arrangement positions of the waterproof films, and therefore, the size and arrangement positions of the waterproof films may be set according to the required bendability in practical applications. As water and oxygen molecules may pass through the spacings between the waterproof films, the spacings in one matrix membrane and the waterproof films in a matrix membrane adjacent to said one matrix membrane are provided oppositely in this embodiment, which allows the water and oxygen molecules passing through the spacings of said one matrix membrane to be blocked by the waterproof films in the matrix membrane adjacent to said one matrix membrane. Specifically, the dotted arrow in FIG. 1 shows a permeation path of the water and oxygen molecules in the composite film. The water and oxygen molecules are blocked by the waterproof film in the matrix membrane 12 after passing through the spacing in the matrix membrane 11 such that the permeation process is suspended. After passing through the spacing in the matrix membrane 12, the water and oxygen molecules are further blocked by the waterproof films in the matrix membrane 13, such that the permeation process is further suspended. In conclusion, in this embodiment, each spacing between adjacent waterproof films in each of the matrix membranes is opposite to a waterproof film in an adjacent matrix membrane, which lengthens the length of the permeation path of water and oxygen molecules, therefore, the permeation process of water and oxygen molecules is greatly suspended, and it is thus ensured that the composite film has good water-tightness.

The composite film provided by the present invention includes a plurality of matrix membranes, and each of the matrix membranes includes at least one waterproof film. The composite film can be directly disposed on an OLED when encapsulating the OLED using the composite film. Therefore, during an encapsulation process, the used process is simple, the process steps become less, the process time is short, and the required equipment is simpler, so that the production cost is reduced, and the production efficiency is improved.

Figure 3:
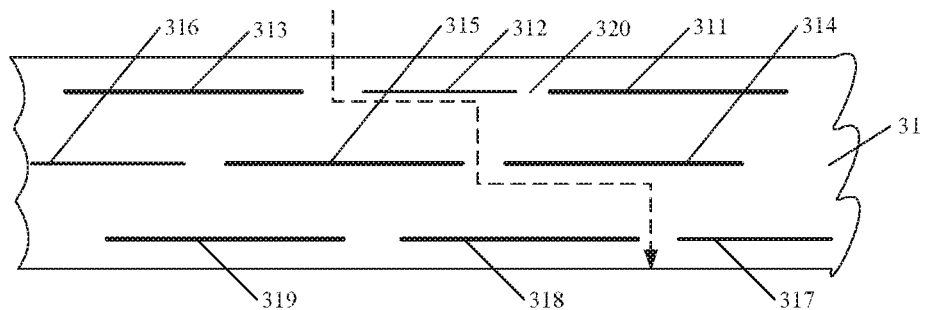
FIG. 3 is a diagram of a structure of a composite film according to Embodiment 2 of the present invention.

FIG. 3 is a schematic diagram of an exemplary structure of a composite film provided by Embodiment 2 of the present invention. As shown in FIG. 3, the composite film includes one matrix membrane 31, and the matrix membrane 31 includes at least one waterproof film 311-319.

In this embodiment, there is one matrix membrane 31. Preferably, the thickness of the matrix membrane is 1 μm-1000 μm. In this embodiment, as the thickness of the matrix membrane is 1 μm-1000 μm, both the problem of poor mechanical performance and poor watertightness due to too small thickness of the matrix membrane and the problem of poor bendability and poor light transmission due to too large thickness of the matrix membrane may be effectively avoided, thus, not only good mechanical performance and watertightness of the matrix membrane but also good bendability and light transmission of the matrix membrane are ensured.

Preferably, the matrix membrane is a flexible film. The material of the matrix membrane may be selected from a group comprising the following materials: polyimide, polyacrylate, polyethylene, polypropylene, polystyrene, polyethylene glycol terephthalate, polyethersulfone, polyethylene naphthalate, polycarbonate, polyvinyl chloride, polymethyl methacrylate, polybutylene terephthalate and poly(p-phenyl diethylsulfone). The waterproof films are rigid films. The material of the waterproof films may be selected from a group comprising the following materials: SiO$_x$, SiN$_x$, Al$_2$O$_3$, Al, Ag, gold, ultrathin glass, diamond, graphene, ZnO, ZrO, and TiO$_2$. However, both the material of the matrix membrane and the material of the waterproof films are not limited to the above-listed materials.

There are a plurality of waterproof films, and the waterproof films are capable of blocking water and oxygen molecules. In this embodiment, the description is given by taking a case in which three layers of waterproof films are arranged in the matrix membrane 31 as an example. As shown in FIG. 3, the waterproof films in the first layer include: a waterproof film 311, a waterproof film 312 and a waterproof film 313; the waterproof films in the second layer include: a waterproof film 314, a waterproof film 315 and a waterproof film 316; and, the waterproof films in the third layer include: a waterproof film 317, a waterproof film 318 and a waterproof film 319. Preferably, the plurality of waterproof films in a same layer are arranged in a same plane. Preferably, the waterproof films are arranged at uniform intervals.

Preferably, the waterproof films in adjacent layers are staggered with each other. As shown in FIG. 3, the waterproof films in the first layer are staggered with the waterproof films in the second layer, and the waterproof films in the second layer are staggered with the waterproof films in the third layer. Specifically, a spacing is formed between adjacent waterproof films in the same layer, and the spacing between adjacent waterproof films in one layer is opposite to the waterproof film in a layer adjacent to said one layer. As the transverse width of each spacing (the distance between any two adjacent waterproof films in a same layer) is less than that of the waterproof films opposite to the spacing, the spacing between the waterproof films in this layer is covered by the waterproof film in the adjacent layer. As shown in FIG. 3, for example, the spacing 320 is formed between the waterproof film 311 and the waterproof film 312 in the first layer, and the spacing 320 is opposite to the waterproof film 314 in the second layer, so that the projection of the spacing 320 on the bottom surface of the matrix membrane 31 is within a range of the projection of the waterproof film 314 on the bottom surface of the matrix membrane 31. As the matrix membrane is a flexible film while the waterproof films are rigid films, the spacings between the waterproof films allow that the whole composite film can be bent to a certain extent, and it is ensured that the composite film has good bendability, so that the composite film is applicable to flexible OLEDs. In this embodiment, the bendability of the composite film is related to the size and arrangement positions of the waterproof films, and therefore, the size and arrangement positions of the waterproof films may be set according to the required bendability in practical applications. As water and oxygen molecules can pass through the spacings between the waterproof films, the spacings between adjacent waterproof films in one layer and the waterproof films in a layer adjacent to said one layer are provided oppositely in this embodiment, which allows the water and oxygen molecules passing through the spacings of said one matrix membrane to be blocked by the waterproof films in the layer adjacent to said one layer. Specifically, the dotted arrow in FIG. 3 shows a permeation path of water and oxygen molecules in the composite film. The water and oxygen molecules are blocked by the waterproof film in the second layer after passing through the spacing between the waterproof films in the first layer, such that the permeation process is suspended. After passing through the spacing between the waterproof films in the second layer, the water and oxygen molecules are further blocked by the waterproof film in the third layer, such that the permeation process is further suspended. In conclusion, in this embodiment, each spacing between adjacent waterproof films in one layer is opposite to the waterproof film in the layer adjacent to said one layer, which lengthens the length of the permeation path of water and oxygen molecules, therefore, the permeation process of water and oxygen molecules is greatly suspended, and it is thus ensured that the composite film has good watertightness.

The composite film provided by the present invention includes a matrix membrane and at least one waterproof film located inside the matrix membrane. The composite film can be directly disposed on an OLED when encapsulating the OLED using the composite film. Therefore, during an encapsulation process, the used process is simple, the process steps become less, the process time is short, and the required equipment is simpler, so that the production cost is reduced, and the production efficiency is improved.

Figure 4:
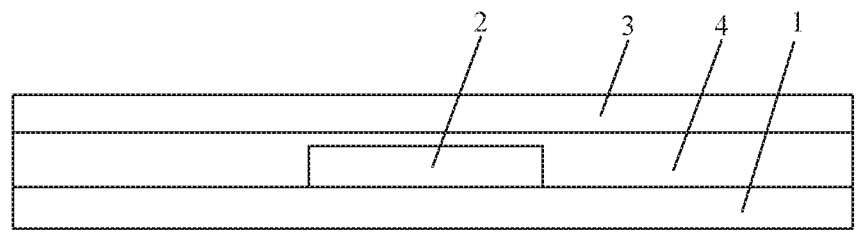
FIG. 4 is a schematic diagram of an encapsulation structure according to Embodiment 3 of the present invention.

FIG. 4 is a schematic diagram of an encapsulation structure provided by Embodiment 3 of the present invention. As shown in FIG. 4, the encapsulation structure includes a substrate 1, an OLED 2 and a composite film 3. The OLED 2 is located on the substrate 1, and the composite film 3 is located on the OLED 2, wherein, the composite film 3 may be the composite provided in Embodiment 1 or Embodiment 2, and will not be repeated redundantly here.

The composite film 3 may have an effect of blocking water from the OLED 2. Optionally, the composite film 3 covers the whole substrate 1.

Optionally, the encapsulation structure may further include a buffer layer 4, which is located between the OLED 2 and the composite film 3, and covers the whole substrate 1.

In the encapsulation structure provided by this embodiment, the composite film includes a matrix membrane and at least one waterproof film located inside the matrix membrane. The composite film can be directly disposed on an OLED when encapsulating the OLED using the composite film. Therefore, during an encapsulation process, the used process is simple, the process steps become less, the process time is short, and the required equipment is simpler, so that the production cost is reduced, and the production efficiency is improved.

According to another aspect of the present invention, a manufacturing method of a composite film is provided. The method includes a step of: forming a matrix membrane, and forming at least one waterproof film in the matrix membrane in a process of forming the matrix membrane.

The composite film manufactured by the manufacturing method of a composite film provided by the present invention includes a matrix membrane, and at least one waterproof film is formed in the matrix membrane. The composite film can be directly disposed on an OLED when encapsulating the OLED using the composite film. Therefore, during an encapsulation process, the used process is simple, the process steps become less, the process time is short, and the required equipment is simpler, so that the production cost is reduced, and the production efficiency is improved.

Figure 5:
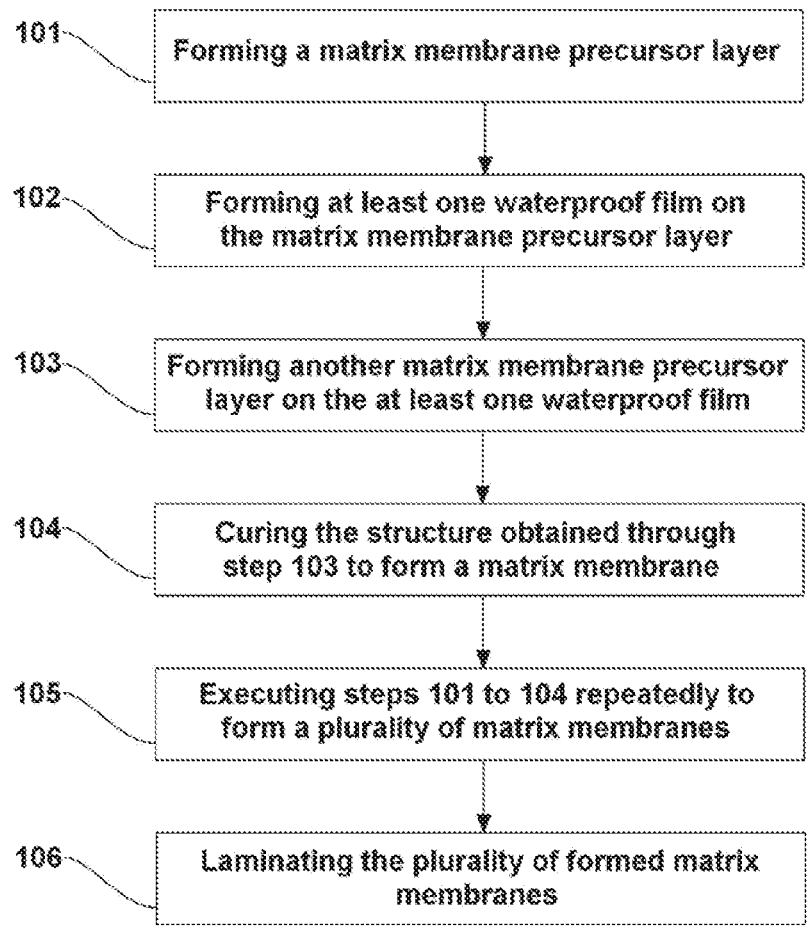
FIG. 5 is a flowchart of a manufacturing method of a composite film according to Embodiment 4 of the present invention.

FIG. 5 is a flowchart of a manufacturing method of a composite film according to Embodiment 4 of the present invention. As shown in FIG. 5, the method includes steps as follows.

At step 101, a matrix membrane precursor layer is formed.

Figure 6A:
FIG. 6a is a schematic diagram of forming a matrix membrane precursor layer in the manufacturing method of a composite film according to Embodiment 4 of the present invention.

FIG. 6a is a schematic diagram of forming a matrix membrane precursor layer in the manufacturing method of a composite film according to Embodiment 4 of the present invention. As shown in FIG. 6a, a matrix membrane precursor layer 61 is formed by spin-coating, blade-coating or spray-coating. The matrix membrane precursor layer 61 may be formed from flexible material.

At Step 102, at least one waterproof film is formed on the matrix membrane precursor layer.

Figure 6B:
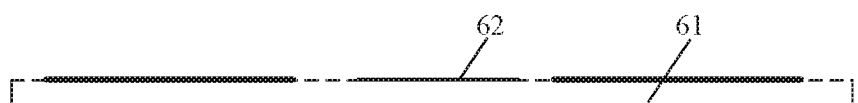
FIG. 6b is a schematic diagram of forming a waterproof film in the manufacturing method of a composite film according to Embodiment 4 of the present invention.

FIG. 6b is a schematic diagram of forming waterproof films in the manufacturing method of a composite film according to Embodiment 4 of the present invention. As shown in FIG. 6b, waterproof films 62 are formed on the matrix membrane precursor layer 61 by placing, physical deposition or chemical deposition. There may be a plurality of waterproof films 62, and a spacing may be formed between two adjacent waterproof films 62. Preferably, the spacings between adjacent waterproof films 62, i.e., the lengths of the spacings in a horizontal direction shown in FIG. 6b, may be of an equal size. The waterproof films 62 may be formed from rigid material.

At step 103, another matrix membrane precursor layer is formed on the at least one waterproof film.

Figure 6C:
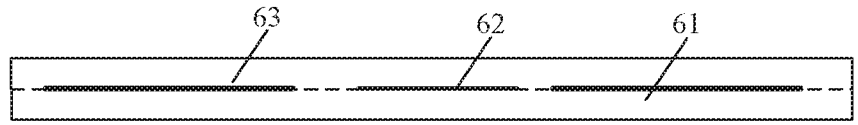
FIG. 6c is a schematic diagram of forming another matrix membrane precursor layer in the manufacturing method of a composite film according to Embodiment 4 of the present invention.

FIG. 6c is a schematic diagram of forming another matrix membrane precursor layer in the manufacturing method of a composite film according to Embodiment 4 of the present invention. As shown in FIG. 6c, a matrix membrane precursor layer 63 is formed on the waterproof films 62 by spin-coating, blade-coating or spray-coating. Similarly, the matrix membrane precursor layer 63 may be formed from flexible material. After step 103, a laminated structure including the matrix membrane precursor layer 61, the matrix membrane precursor layer 63 and a plurality of waterproof films 62 sandwiched therebetween is obtained.

At step 104, the structure obtained through step 103 is cured to form a matrix membrane.

Figure 6D:
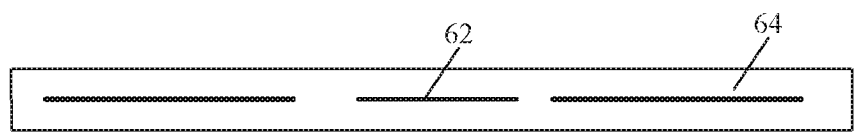
FIG. 6d is a schematic diagram of a curing process in the manufacturing method of a composite film according to Embodiment 4 of the present invention.

FIG. 6d is a schematic diagram of a curing process in the manufacturing method of a composite film according to Embodiment 4 of the present invention. As shown in FIG. 6d, the structure obtained through step 103 is cured by UV curing or thermocuring so as to form a matrix membrane 64.

At step 105, steps 101-104 are executed repeatedly so as to fabricate a plurality of matrix membranes.

At Step 106, the plurality of formed matrix membranes are laminated.

Specifically, the plurality of formed matrix membranes may be laminated by a laminating device so as to form a composite film, wherein the waterproof films in two adjacent matrix membranes are staggered with each other. That is, each waterproof film in one matrix membrane is set to be opposite to each spacing included in the matrix membrane adjacent to said one matrix membrane.

The manufacturing method of a composite film provided by this embodiment may be used for manufacturing the composite film described in Embodiment 1, and therefore, the specific description of the matrix membranes and waterproof films can refer to Embodiment 1 and will not be repeated redundantly here.

The composite film manufactured by the manufacturing method of a composite film provided by the present invention includes matrix membranes and at least one waterproof film located in the matrix membranes. The composite film can be directly disposed on an OLED during encapsulating the OLED using the composite film. Therefore, during an encapsulation process, the used process is simple, the process steps become less, the process time is short, and the required equipment is simpler, so that the production cost is reduced, and the production efficiency is improved.

Figure 7:
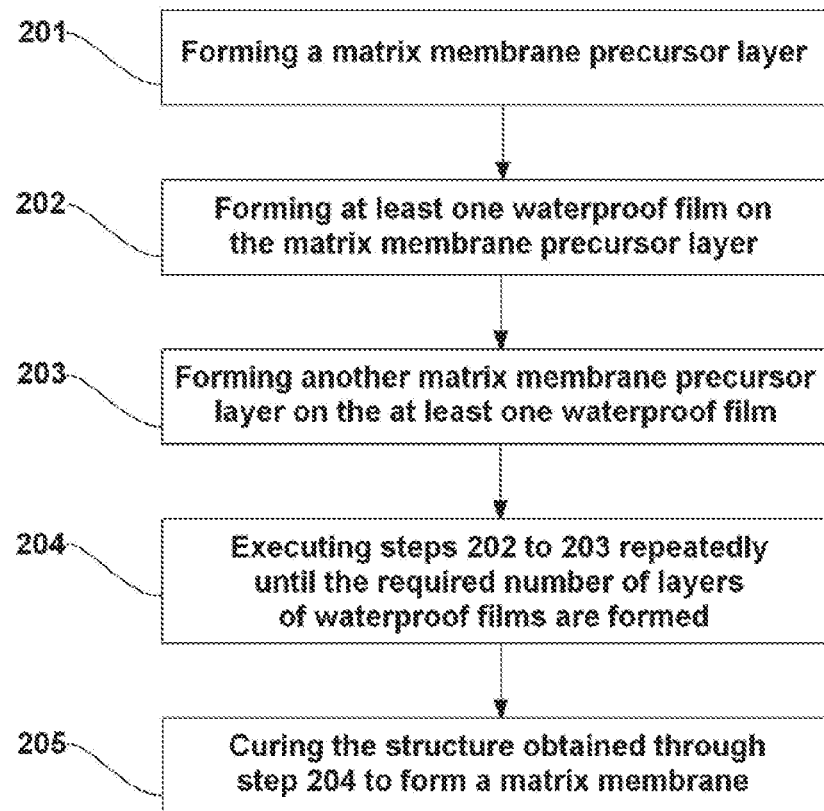
FIG. 7 is a flowchart of a manufacturing method of a composite film according to Embodiment 5 of the present invention.

FIG. 7 is a flowchart of a manufacturing method of a composite film provided by Embodiment 5 of the present invention. As shown in FIG. 7, the method includes steps as follows.

At step 201, a matrix membrane precursor layer is formed.

Figure 8A:
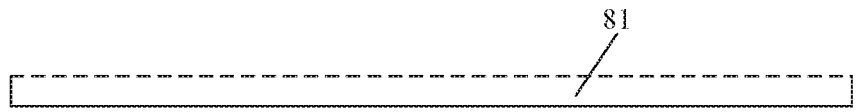
FIG. 8a is a schematic diagram of forming a matrix membrane precursor layer in the manufacturing method of a composite film according to Embodiment 5 of the present invention.

FIG. 8a is a schematic diagram of forming a matrix membrane precursor layer in the manufacturing method of a composite film according to Embodiment 5 of the present invention. As shown in FIG. 8a, a matrix membrane precursor layer 81 is formed by spin-coating, blade-coating or spray-coating. The matrix membrane precursor layer 81 may be formed from flexible material.

At step 202, at least one waterproof film is formed on the matrix membrane precursor layer.

Figure 8B:
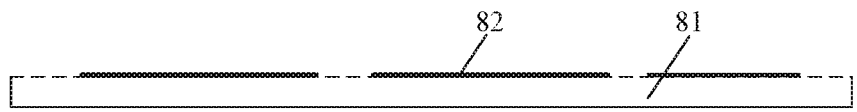
FIG. 8b is a schematic diagram of an example of forming a waterproof film in the manufacturing method of a composite film according to Embodiment 5 of the present invention.

FIG. 8b is a schematic diagram of forming waterproof films in the manufacturing method of a composite film according to Embodiment 5 of the present invention. As shown in FIG. 8b, a layer of waterproof films 82 is formed on the matrix membrane precursor layer 81 by placing, physical deposition or chemical deposition. There may be a plurality of waterproof films 82, and a spacing may be formed between two adjacent waterproof films 82. Preferably, the spacings between adjacent waterproof films 82, i.e., the lengths of the spacings in a horizontal direction as shown in FIG. 6b, may be of an equal size. The waterproof films 82 may be formed from rigid material.

At step 203, another matrix membrane precursor layer is formed on the at least one waterproof film.

Figure 8C:
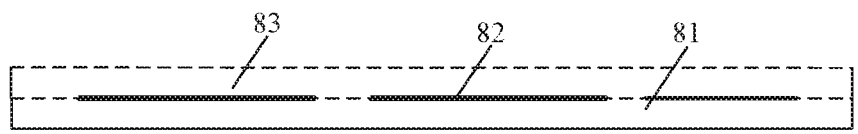
FIG. 8c is a schematic diagram of forming another matrix membrane precursor layer in the manufacturing method of a composite film according to Embodiment 5 of the present invention.

FIG. 8c is a schematic diagram of forming another matrix membrane precursor layer in the manufacturing method of a composite film according to Embodiment 5 of the present invention. As shown in FIG. 8c, a matrix membrane precursor layer 83 is formed on the waterproof films 82 by spin-coating, blade-coating or spray-coating. Similarly, the matrix membrane precursor layer 83 may be formed from flexible material.

At step 204: steps 202-203 are executed repeatedly until the required layers of waterproof films are formed.

Figure 8D:
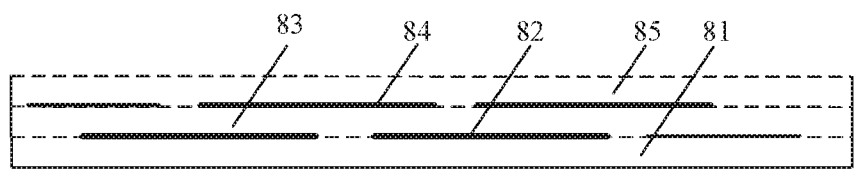
FIG. 8d is a schematic diagram of forming other waterproof films and matrix membrane precursor layers in the manufacturing method of a composite film according to Embodiment 5 of the present invention.

In this embodiment, the description is performed by taking a case in which three layers of waterproof films are formed as an example. FIG. 8d is a schematic diagram of forming three layers of waterproof films and three layers of matrix membrane precursor layers in Embodiment 5. As shown in FIG. 8d, a plurality of waterproof films 84 are formed on the matrix membrane precursor layer 83 by placement, physical deposition or chemical deposition, so that each spacing between two adjacent waterproof films 84 is opposite to a waterproof film 82 formed in step 202, and the waterproof films 82 in the former layer are staggered with the waterproof films 84 in the latter layer. Then, similarly, a matrix membrane precursor layer 85 is formed on the waterproof films 84 by spin-coating, blade-coating or spray-coating, and waterproof films 86 are formed on the matrix membrane precursor layer 85 by placement, physical deposition or chemical deposition, so that the spacings between any two adjacent waterproof films 86 are opposite to the waterproof films 84, respectively. Subsequently, a matrix membrane precursor layer 87 is formed on the waterproof films 86 by spin-coating, blade-coating or spray-coating. Therefore, a laminated structure including the matrix membrane precursor layer 81, the first layer of waterproof films 82, the matrix membrane precursor layer 83, the second layer of waterproof films 84, the matrix membrane precursor layer 85, the third layer of waterproof films 86 and the matrix membrane precursor layer 87, which are sequentially provided, are formed.

At step 205: the structure obtained through step 204 is cured to form a matrix membrane.

Figure 8E:
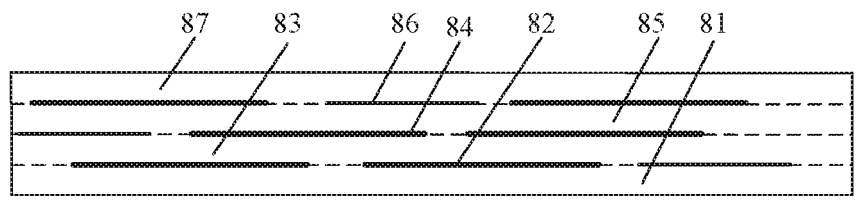
FIG. 8e is a schematic diagram of a curing process in the manufacturing method of a composite film according to Embodiment 5 of the present invention.

FIG. 8e is a schematic diagram of a curing process in the manufacturing method of a composite film according to Embodiment 5 of the present invention. As shown in FIG. 8e, the structure obtained through step 204 is cured by UV curing or thermocuring so as to form a matrix membrane 8, wherein the waterproof films in two adjacent layers are staggered with each other. That is, each waterproof film in one layer is set to be opposite to the spacing included in a layer adjacent to said one layer.

In the composite film manufactured by the manufacturing method of a composite film provided by this embodiment, one matrix membrane and a plurality of waterproof films are included, and the plurality of waterproof films are arranged by layers.

The manufacturing method of a composite film provided by this embodiment may be used for manufacturing the above composite film described in Embodiment 2, and therefore, the specific description of the matrix membrane and waterproof films may refer to Embodiment 2 and will not be repeated redundantly here.

The composite film manufactured by the manufacturing method of a composite film provided by the present embodiment includes a matrix membrane and at least one waterproof film located in the matrix membrane. The composite film can be directly disposed on an OLED when encapsulating the OLED using the composite film. Therefore, during an encapsulation process, the used process is simple, the process steps become less, the process time is short, and the required equipment is simpler, so that the production cost is reduced, and the production efficiency is improved.

It should be understood that the foregoing implementations are merely exemplary implementations for describing the principle of the present invention, but the present invention is not limited thereto. A person of ordinary skill in the art may make various transformations and improvements without departing from the spirit and essence of the present invention, and these transformations and improvements are also deemed as falling into the protection scope of the present invention.

The invention claimed is:

1. A manufacturing method of an OLED encapsulation film comprising a step of:
   a) forming a matrix membrane precursor layer;
   b) depositing at least three waterproof films on a surface of the matrix membrane precursor layer, a spacing being formed between every two adjacent waterproof films, and lengths of spacings between the waterproof films in a direction parallel to the surface of the matrix membrane precursor layer where the plurality of waterproof films are located being the same;
   c) forming another matrix membrane precursor layer on the waterproof films; and
   d) performing a curing process to form one matrix membrane, wherein the waterproof films are formed of a rigid material selected from a group comprising the following materials: SiOx, SiNx, Al2O3, Al, Ag, gold, ultrathin glass, diamond, graphene, ZnO, ZrO, and TiO2.

2. The manufacturing method of an OLED encapsulation film according to claim 1, further comprising steps of:
   executing steps a)-d) repeatedly to obtain a plurality of matrix membranes, and laminating the plurality of matrix membranes to form an OLED encapsulation film comprising the plurality of laminated matrix membranes, wherein the waterproof films in two adjacent matrix membranes are staggered with each other.

3. The manufacturing method of an OLED encapsulation film according to claim 1, wherein the curing process is performed through UV curing or thermocuring.

* * * * *